(12) United States Patent
Kumazawa et al.

(10) Patent No.: US 7,985,078 B2
(45) Date of Patent: Jul. 26, 2011

(54) ELECTRODE JUNCTION STRUCTURE AND MANUFACTURING METHOD THEREOF

(75) Inventors: Kentaro Kumazawa, Osaka (JP); Masahiro Ono, Osaka (JP); Yoshihiro Tomura, Osaka (JP)

(73) Assignee: Panasonic Corporation, Osaka (JP)

(*) Notice: Subject to any disclaimer, the term of this patent is extended or adjusted under 35 U.S.C. 154(b) by 0 days.

(21) Appl. No.: 12/644,571

(22) Filed: Dec. 22, 2009

(65) Prior Publication Data
US 2010/0167597 A1 Jul. 1, 2010

(30) Foreign Application Priority Data

Dec. 25, 2008 (JP) ................................. 2008-329294

(51) Int. Cl.
*H01R 12/00* (2006.01)
(52) U.S. Cl. .......................................... 439/67; 349/150
(58) Field of Classification Search .................. 439/65, 439/67, 77; 349/149–152
See application file for complete search history.

(56) References Cited

U.S. PATENT DOCUMENTS

| 5,317,438 A | * | 5/1994 | Suzuki et al. | ................. 349/192 |
| 6,086,441 A | * | 7/2000 | Akiguchi et al. | ............... 445/24 |
| 6,952,250 B2 | * | 10/2005 | Ueda | ............................. 349/150 |

FOREIGN PATENT DOCUMENTS
JP 11-016502 1/1999
* cited by examiner

*Primary Examiner* — Thanh-Tam T Le
(74) *Attorney, Agent, or Firm* — Wenderoth, Lind & Ponack, L.L.P.

(57) ABSTRACT

The electrode junction structure includes: a glass substrate; a plurality of flexible substrates, in a planar view, arranged to cross over an edge of the glass substrate and arranged to have a space from each other along the edge; an adhesive for joining the glass substrate and each flexible substrate; and a sealing resin for covering junction portions between the glass substrate and each flexible substrate, wherein an edge of the sealing resin is formed so that the edge of the sealing resin has, in the planar view, a consecutive waveform portion in which a convex portion and a concave portion alternate with an imaginary line as a center axis, the imaginary line being parallel to the edge of the glass substrate and locating outer than the edge of the glass substrate, and wherein the convex portions are formed to be located on the flexible substrates.

15 Claims, 20 Drawing Sheets

Fig.26 - PRIOR ART
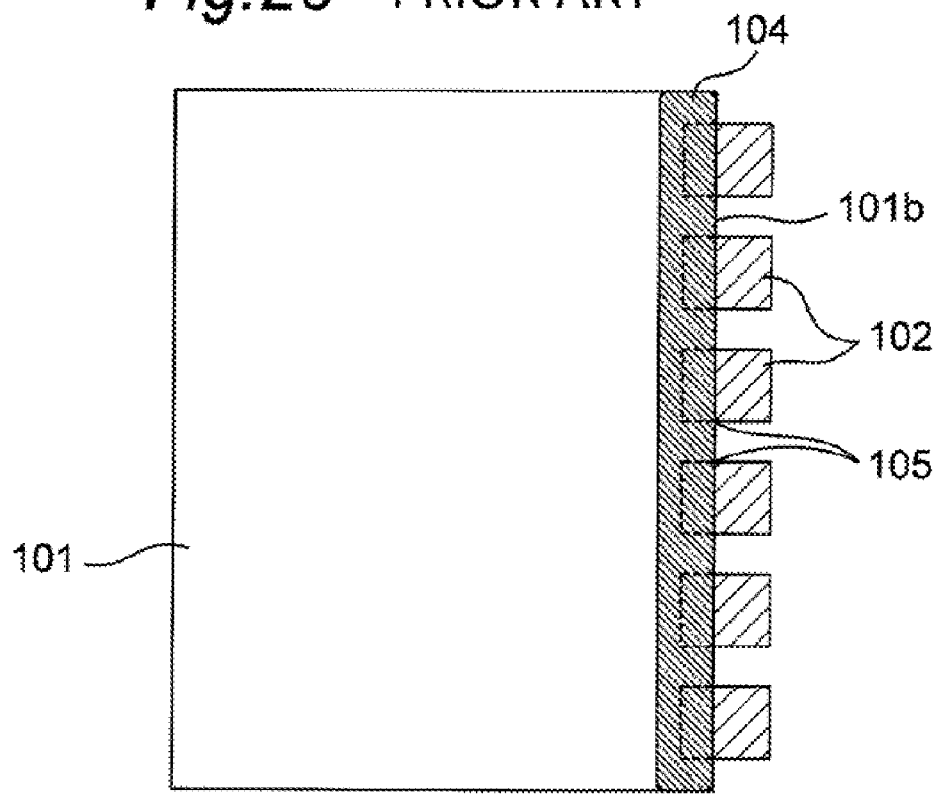
Fig.27 - PRIOR ART
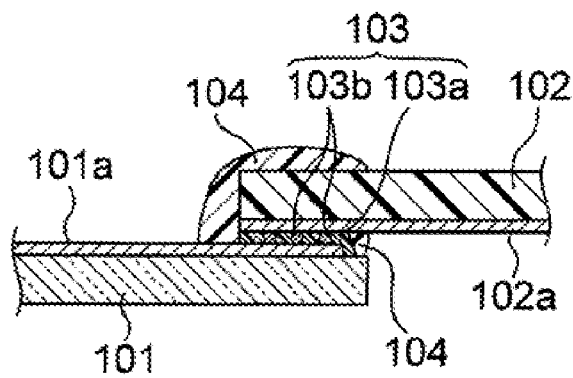

*Fig.28* - PRIOR ART
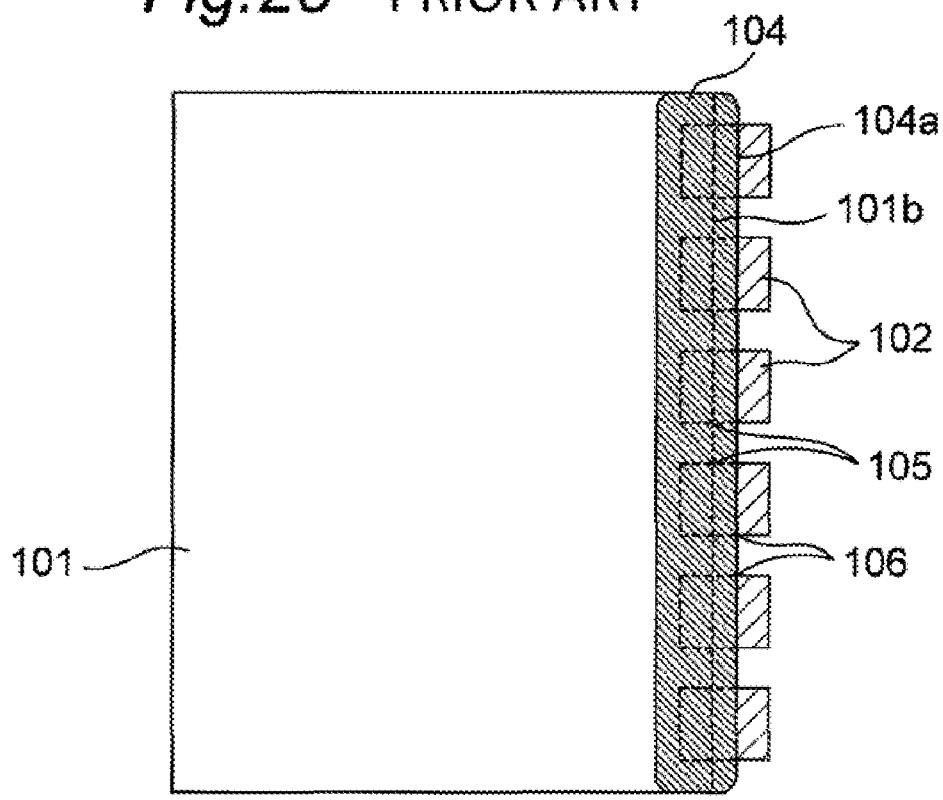
*Fig.29* - PRIOR ART
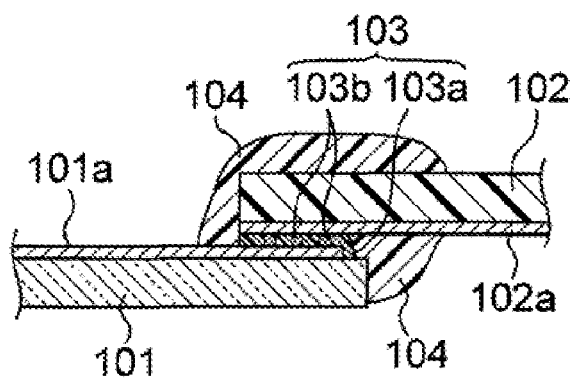

ELECTRODE JUNCTION STRUCTURE AND MANUFACTURING METHOD THEREOF

BACKGROUND OF THE INVENTION

The present invention relates to an electrode junction structure in which electrodes formed on a glass substrate and electrodes formed on flexible substrates are electrically joined with an adhesive, and in which junction portions between glass substrate and flexible substrate are covered with a sealing resin so as not to be exposed to outside, and a method for manufacturing the electrode junction structure.

Conventionally, this type of electrode junction structure is known to have various types of structures. For example, conventional electrode junction structures include structures shown in FIGS. 26 and 27. FIG. 26 is a plan view of an electrode junction structure according to a first conventional example, and FIG. 27 is a cross-sectional view of a portion of the electrode junction structure according to the first conventional example.

The electrode junction structure according to the first conventional example has a rectangular glass substrate 101, and a plurality of rectangular flexible substrates 102, in a planar view, arranged to cross over an edge 101b of the glass substrate 101 and arranged to have a space from each other along the edge 101b of the glass substrate 101. A plurality of electrodes 101a is formed in the shape of a stripe on a surface of the glass substrate 101. A plurality of electrodes 102a is formed in positions corresponding to the electrodes 101a, on a surface of the flexible substrates 102 opposed to the surface of the glass substrate 101. The glass substrate 101 and the flexible substrates 102 are joined with an ACF (anisotropic conductive sheet) 103 with conductive particles 103b dispersed in an insulating adhesive resin 103a, and the electrodes 101a of the glass substrate 101 and the electrodes 102a of the flexible substrates 102 are brought into electrical continuity via the conductive particles 103b. The junction portions between the glass substrate 101 and the flexible substrates 102 are covered by a sealing resin 104 for the purpose of moisture proof so as not to be exposed to outside.

Furthermore, electrode junction structures which have such a structure include a structure described in Patent Document 1 (Japanese Unexamined Patent Publication No. 11-16502). FIG. 28 is a plan view of an electrode junction structure according to a second conventional example, described in Patent Document 1, and FIG. 29 is a cross-sectional view of a portion of the electrode junction structure according to the second conventional example.

The electrode junction structure according to the second conventional example is configured so that an edge 104 of the sealing resin 104 is located outer than the edge 101b of the glass substrate 101 in the planar view seen from a thickness direction of the glass substrate 101.

SUMMARY OF THE INVENTION

In the electrode junction structure according to the first conventional example, when an external force is applied to the flexible substrates 102 during a manufacturing process for the electrode junction structure or during an attachment of the electrode junction structure to a other device, there is a possibility that stress is concentrated around an intersection point 105 of the edge 101b of the glass substrate 101 with an edge of the flexible substrate 102 to destroy the flexible substrate 102 or cause detachment at the junction portions between the glass substrate 101 and the flexible substrate 102. In the electrode junction structure according to the first conventional example described above, such defects occur on the order of about 0.5%.

On the other hand, in the electrode junction structure according to the second conventional example, the vicinity of the intersection point 105 of the edge 101b of the glass substrate 101 with the edge of the flexible substrate 102 is covered with the sealing resin 104, thereby allowing stress concentration around the intersection point 105 to be prevented. However, in this case, since the flexible substrates 102 are firmly fixed by the sealing resin 104 from both sides of the flexible substrates 102, stress will be concentrated around an intersection point 106 of the edge of the flexible substrate 102 with the sealing resin 104. Therefore, the defects can be prevented insufficiently.

Moreover, in the case of using the electrode junction structure according to the second conventional example for a plasma display panel (hereinafter, referred to as a PDP), that is, in the case of using the glass substrate 101 as a front panel or a back panel for a PDP, a portion in which the flexible substrates 102 and the sealing resin 104 exist is not involved in displaying images. Thus, the area of the portion described above in the planar view is required to be reduced as much as possible.

Conventionally, in order to reduce the area of this portion, it has been common to curve (for example, 90 degrees or more) the flexible substrates 102 with respect to the surface of the glass substrate 101. In the electrode junction structure according to the example conventional example, a portion of the flexible substrate 102 outer than the edge 101b of the glass substrate 101 can be curved. However, in the electrode junction structure according to the second conventional example, a portion of the flexible substrate 102 outer than the edge 101b of the glass substrate 101 also has a predetermined length of the sealing resin 104 on both sides of the flexible substrate 102. Therefore, in the electrode junction structure according to the second conventional example, it is difficult to curve a portion of the flexible substrate 102 covered with the sealing resin 104, resulting in the problem that an area described above is not able to be reduced.

Therefore, the present invention has been devised to improve the issues and an object thereof is to provide an electrode junction structure which can prevent defects from being caused due to an external force applied to the flexible substrates and which can reduce the area of the sealing resin and flexible substrates in the planar view, and a method for manufacturing the electrode junction structure.

In order to achieve the object, the present invention is configured as follows.

A first aspect of the present invention provides an electrode junction structure including:

a glass substrate having a plurality of electrodes on a surface of the glass substrate;

a plurality of flexible substrates which are, in a planar view, arranged to cross over an edge of the glass substrate and arranged to have a space from each other along the edge of the glass substrate, the each of flexible substrates having a plurality of electrodes on a surface the flexible substrate opposed to the surface of the glass substrate;

an adhesive for electrically joining the electrodes of the glass substrate and the electrodes of the respective flexible substrates; and a sealing resin for covering junction portions between the glass substrate and the respective flexible substrates so as not to be exposed to outside, wherein an edge of the sealing resin is formed so that the edge of the sealing resin has, in the planar view, a consecutive waveform portion in which a convex portion and a concave portion alternate with an imaginary line as a center axis, the imaginary line being parallel to the edge of the glass substrate and locating outer than the edge of the glass substrate, and wherein the convex portions are formed to be located on the flexible substrates.

A second aspect of the present invention provides the electrode junction structure according to the first aspect, wherein the edge of the sealing resin on the flexible substrate and the edge of the flexible substrate intersects with each other at an acute angle.

A third aspect of the present invention provides the electrode junction structure according to the first or second aspect, wherein the edge of the sealing resin passes through, in the planar view, an intersection point of the edge of the glass substrate with the edge of the flexible substrate.

A fourth aspect of the present invention provides the electrode junction structure according to any one of the first to third aspects, wherein a distance from a top of the convex portion to a bottom of the concave portion in a direction perpendicular to the edge of the glass substrate is 1 mm or more and 6 mm or less.

A fifth aspect of the present invention provides the electrode junction structure according to any one of the first to fourth aspects, wherein the sealing resin is formed so that a height from the edge of the glass substrate is uniform in a cross section crossing the edge of the glass substrate and taken along a plane perpendicular to the surface of the glass substrate.

A sixth aspect of the present invention provides the electrode junction structure according to any one of the first to fifth aspects, wherein the convex portion is formed to have a plurality of mountain shapes with at least one inwardly recessed portion.

A seventh aspect of the present invention provides the electrode junction structure according to the sixth aspect, wherein a portion of the flexible substrate corresponding to the recessed portion is provided with a strip-shaped slit.

An eighth aspect of the present invention provides the electrode junction structure according to the sixth or seventh aspect, wherein the convex portions are formed so that heads of the mountain shapes adjacent to each other are arranged four times or more as much spaced apart as a thickness of a thickest portion of the convex portions.

A ninth aspect of the present invention provides the electrode junction structure according to any one of the first to eighth aspects, wherein the flexible substrate is held with a portion of the flexible substrate outer than junction portions with the glass substrate curved by the sealing resin.

A tenth aspect of the present invention provides the electrode junction structure according to the first or second aspect, wherein the sealing resin is formed to exist between the flexible substrates adjacent to each other and outer than the edge of the glass substrate in the planar view.

An eleventh aspect of the present invention provides a method for manufacturing an electrode junction structure, comprising:

arranging a plurality of flexible substrates to cross over an edge of a glass substrate and to have a space from each other along the edge of the glass substrate joining the flexible substrates to the glass substrate by an adhesive so that electrodes formed on each substrate are brought into electrical continuity, carrying out a treatment for cleaning a predetermined portion for forming the sealing resin to improve wettability, wherein an edge of the predetermined portion has, in the planar view, a consecutive waveform portion in which a convex portion and a concave portion alternate with an imaginary line as a center axis, the imaginary being parallel to the edge of the glass substrate and locating outer than the edge of the glass substrate, and wherein the convex portions are located on the flexible substrates, and forming a sealing resin so that junction portions between the glass substrate and the respective flexible substrates are not exposed to outside.

A twelfth aspect of the present invention provides the method for manufacturing an electrode junction structure according to the eleventh aspect, wherein the edge of the sealing resin on the flexible substrate and the edge of the flexible substrate intersect with each other at an acute angle.

A thirteenth aspect of the present invention provides the method for manufacturing an electrode junction structure according to the eleventh or twelfth aspect, wherein the forming the sealing resin is carried out with a portion of the flexible substrate outer than the edge of the glass substrate curved.

A fourteenth aspect of the present invention provides the method for manufacturing an electrode junction structure according to the eleventh to thirteenth aspects, wherein the forming of the sealing resin comprises, applying and curing a first sealing resin on one surface side of the flexible substrates, and applying and curing a second sealing resin on the other surface side of the flexible substrates.

A fifteenth aspect of the present invention provides the method for manufacturing an electrode junction structure according to the fourteenth aspect, wherein, when the first sealing resin is to be applied and cured, the first sealing resin is applied and cured so that the first sealing resin is placed between the flexible substrates adjacent to each other, while the other surface of the respective flexible substrates is supported on a support base, when the second sealing resin is to be applied and cured, the second sealing resin is applied and cured to exist on the first sealing resin cured between the flexible substrates adjacent to each other.

According to the electrode junction structure and the method for manufacturing the electrode junction structure according to the present invention, the edge of the sealing resin or the predetermined portion is, in the planar view, formed so that the edge has a consecutive waveform portion in which the convex portion and the concave portion alternate with the imaginary line parallel to the edge of the glass substrate and located outer than the edge of the glass substrate as a center axis, and so that the convex portions are located on the flexible substrates. Therefore, when an external force is applied to the flexible substrates, stress concentration can be prevented to thus prevent defects from being caused.

Furthermore, according to the electrode junction structure and the method for manufacturing the electrode junction structure according to the present invention, the convex portions are made to be located on the flexible substrates. Therefore, as compared with the second conventional example, the flexible substrates can be more easily curved. Thus, the area of the sealing resin and flexible substrates can be reduced in the planar view.

Moreover, according to the method for manufacturing the electrode junction structure according to the present invention, the formation of the sealing resin by application is carried out after carrying out in advance the treatment of cleaning the predetermined portion to improve the wettability. Therefore, the formation of the sealing resin by application is made easier.

BRIEF DESCRIPTION OF THE DRAWINGS

These and other aspects and features of the present invention will become clear from the following description taken in conjunction with the preferred embodiments thereof with reference to the accompanying drawings, in which:

FIG. 26 is a plan view of an electrode junction structure according to a first conventional example;

FIG. 27 is a cross-sectional view of a portion of the electrode junction structure according to the first conventional example;

FIG. 28 is a plan view of an electrode junction structure according to a second conventional example; and FIG. 29 is a cross-sectional view of a portion of the electrode junction structure according to the second conventional example.

DETAILED DESCRIPTION OF THE PREFERRED EMBODIMENTS

Figure 1:
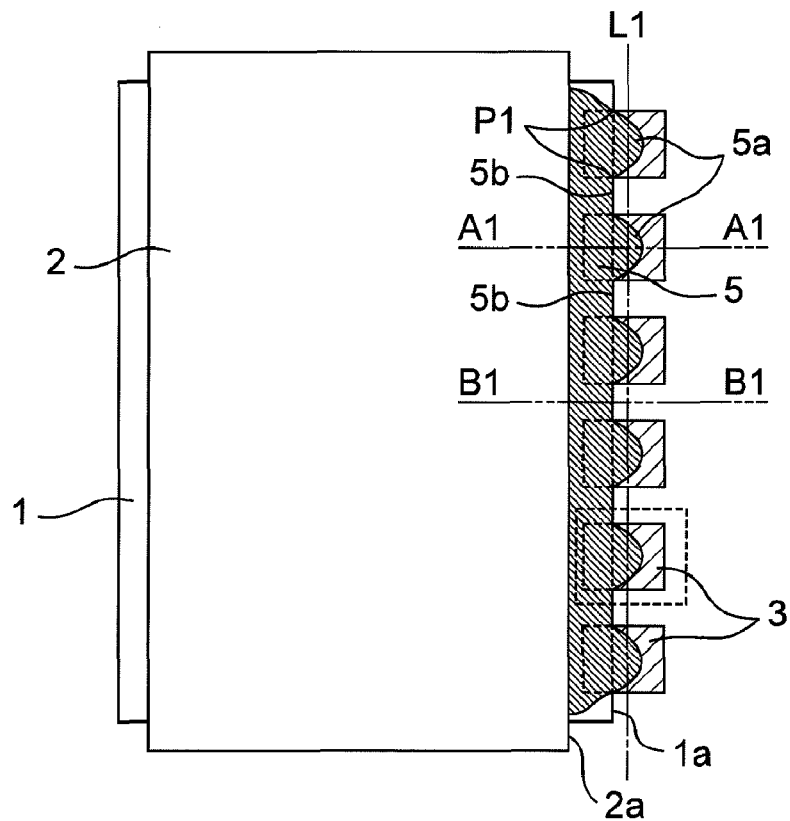
FIG. 1 is a plan view of an electrode junction structure according to a first embodiment of the present invention.

Before the description of the present invention proceeds, it is to be noted that like parts are designated by like reference numerals throughout the accompanying drawings.

Hereinbelow, one embodiment of the present invention is described in detail with reference to the accompanying drawings.

First Embodiment

Figure 2:
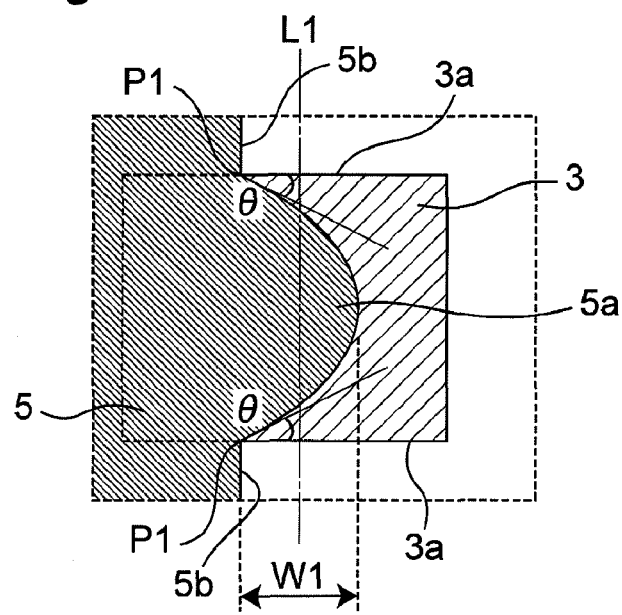
FIG. 2 is an enlarged plan view of a portion of FIG. 1.
Figure 3:
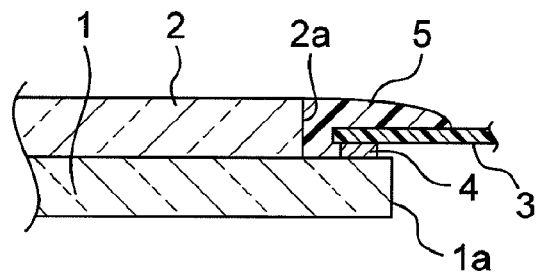
FIG. 3 is a cross-sectional view of FIG. 1 along a line A1-A1.
Figure 4:
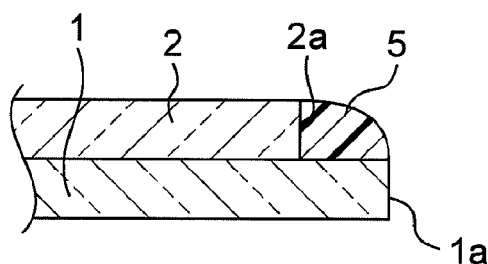
FIG. 4 is a cross-sectional view of FIG. 1 along a line B1-B1.
Figure 5:
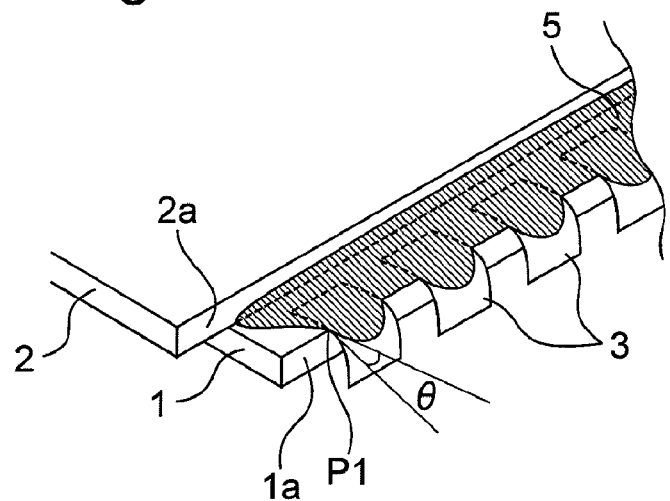
FIG. 5 is a perspective view of the electrode junction structure of FIG. 1.

FIG. 1 is a plan view illustrating a configuration of an electrode junction structure according to a first embodiment of the present invention. FIG. 2 is an enlarged plan view of a portion surrounded by a dotted line in FIG. 1. FIG. 3 is a cross-sectional view of FIG. 1 along a line A1-A1, and FIG. 4 is a cross-sectional view of FIG. 1 along a line B1-B1. FIG. 5 is a perspective view of the electrode junction structure of FIG. 1. The electrode junction structure according to the first embodiment is to be used for PDPs.

In FIG. 1, the electrode junction structure according to the first embodiment has a rectangular first glass substrate 1, a rectangular second glass substrate 2 placed to be opposed to the first glass substrate 1, and a plurality of rectangular flexible substrates 3 joined to the first glass substrate 1.

One of the first glass substrate 1 and the second glass substrate 2 is a front panel for a PDP, whereas the other is a back panel for a PDP. The first glass substrate 1 and the second glass substrate 2 have, for example, a thickness of 1.8 mm, and are bonded to each other with an adhesive (not shown). The first glass substrate 1 has a plurality of strip-shaped electrode, for example, silver electrodes (not shown) formed in the shape of a stripe.

The plurality of flexible substrates 3 is, in the planar view, arranged to cross over an edge 1a of the first glass substrate 1, and arranged to have a space from each other along the edge 1a of the first glass substrate 1. Furthermore, each flexible substrate 3 is arranged so that their edges 3a in a longitudinal direction are perpendicular to the edge 1a of the first glass substrate 1. As the material of the flexible substrates 3, for example, a polyimide can be used. Surfaces of the respective flexible substrates 3, which are opposed to the electrodes of the first glass substrate 1, have a plurality of strip-shaped electrodes, for example, copper electrodes (not shown) formed in the shape of a stripe in positions corresponding to the silver electrodes of the first glass substrate 1.

The silver electrodes of the first glass substrate 1 and the copper electrodes of the flexible substrates 3 are electrically joined with an adhesive 4 such as a solder or an AFC (anisotropic conductive sheet), as shown in FIG. 3. The junction portions between the first glass substrate 1 and the flexible substrates 3 are covered by a sealing resin 5 for the purpose of moisture proof so as not to be exposed to outside.

The sealing resin 5 has, in the planar view, a consecutive waveform portion in which a convex portion 5a like a mountain and a concave portion 5b alternate with an imaginary line L1 parallel to the edge 1a of the first glass substrate 1 and located outer than the edge 1a of the first glass substrate 1 as a center axis, as shown in FIG. 1. Furthermore, the respective convex portions 5a are formed to be located on the flexible substrates 3. The edge 5a of the sealing resin 5 on the flexible substrate 3 and the edge 3a of the flexible substrate 3 intersect with each other at an acute angle. More specifically, the angle θ made by the edge 5a of the sealing resin 5 on the flexible substrate 3 and the edge 3a of the flexible substrate 3 is set at 90 degrees or less. The closer to 0 degrees and the closer to 90 degrees the angle θ is, the more a stress relaxation effect (the effect of preventing stress concentration) is reduced. For example, when the angle θ is less than 10 degrees and when the angle θ is less than 80 degrees, the stress relaxation effect will be less than 20%. On the other hand, when the angle θ is 30 degrees or more and 60 degrees or less, the stress relaxation effect can be expected to be 50% or more. Therefore, the angle θ is preferably 10 degrees or more and 80 degrees or less, and more preferably 30 degrees or more and 60 degrees or less.

Furthermore, it is preferable that the edge 5a of the sealing resin 5 passes through a point on which stress is concentrated, that is, in the planar view, an intersection point P1 of the edge 1a of the first glass substrate 1 with the edge 3a of the flexible substrate 3. This allows stress to be relaxed efficiently.

Moreover, it is preferable that a distance W1 from a top of the convex portion 5a to a bottom of the concave portion 5b in a direction perpendicular to the edge 1a of the first glass substrate 1 be 1 mm or more and 6 mm or less. When the distance W1 is less than 1 mm, the stress relaxation effect is not able to be obtained sufficiently. Furthermore, when the distance W1 is greater than 6 mm, the flexible substrate 3 will have a smaller portion that can be curved. Therefore, in the planar view, it is not possible to reduce the area of a portion in which the flexible substrates 3 and the sealing resin 5 exist, thereby making it difficult to achieve space-saving and large-screen display devices.

In addition, the sealing resin 5 is formed, as will be described later in detail, in such a way that the sealing resin 5 crosses the edge 1a of the first glass substrate 1 and that a height from the edge 1a of the first glass substrate 1 is substantially uniform in a cross section taken along a plane perpendicular to a surface of the first glass substrate 1.

As the material of the sealing resin 5, UV curing resins, silicone resins, polyurethane resins, epoxy resins, and the like can be used.

It is noted that the sealing resin 5 also has a role in protecting a side surface of the second glass substrate 2 from physical damage, since the side surface has wettability. Therefore, while the sealing resin 5 is formed as shown in FIGS. 3 and 4 in the first embodiment, the sealing resin 5 may be formed beyond the side surface and form a wet heap of the sealing resin on the order of 0.5 mm on an upper surface side of the second glass substrate 2 so that the entire side surface of the second glass substrate 2 can be protected.

Next, a method for manufacturing an electrode junction structure according to the first embodiment of the present invention will be described with reference to FIG. 6A through FIG. 9. The method is similar to conventionally well known methods for manufacturing an electrode junction structure, except for the method for forming the sealing rein 5. Therefore, a state before forming the sealing resin 5, that is, a state of the first glass substrate 1 and flexible substrates 3 joined with the adhesive 4 will be first described. Further, an example of adopting acrylic UV curing resins as a material for the sealing resin 5 is herein described.

Figure 6A:
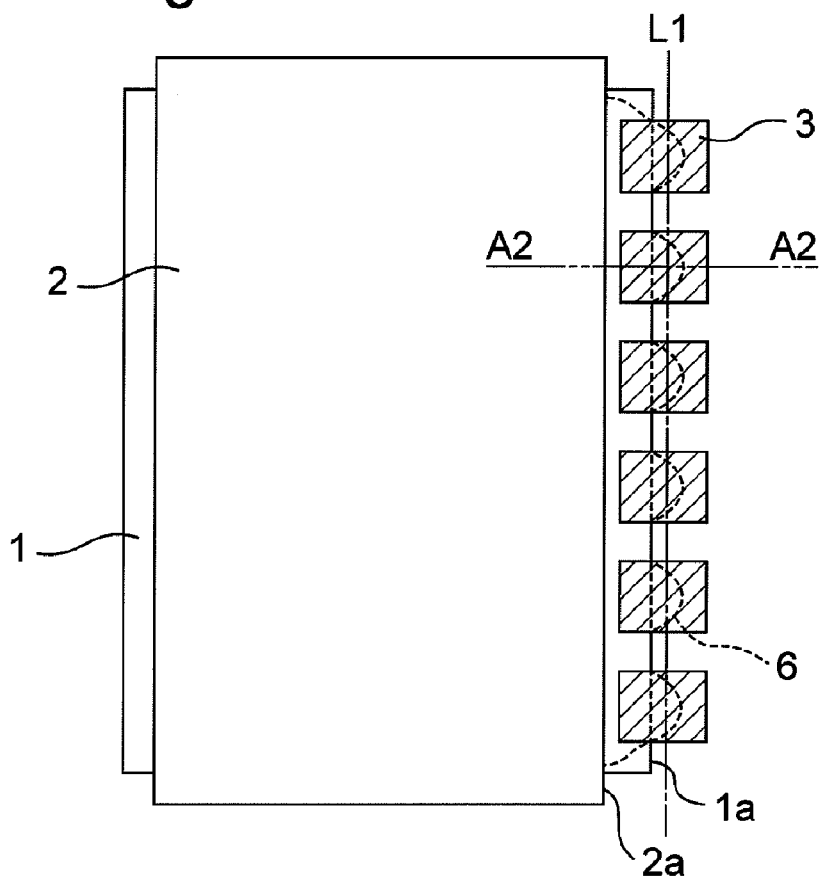
FIG. 6A is a plan view illustrating a state before forming a sealing resin in the electrode junction structure according to the first embodiment of the present invention.
Figure 6B:
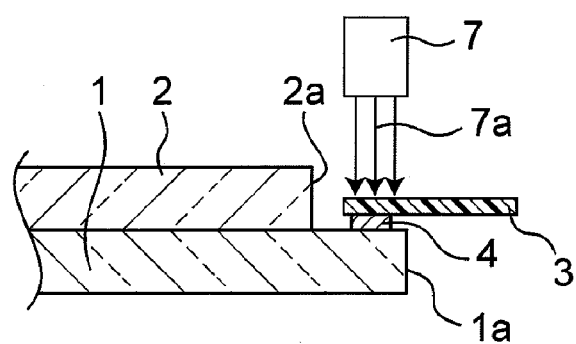
FIG. 6B is a cross-sectional view of FIG. 6A along a line A2-A2.
Figure 7A:
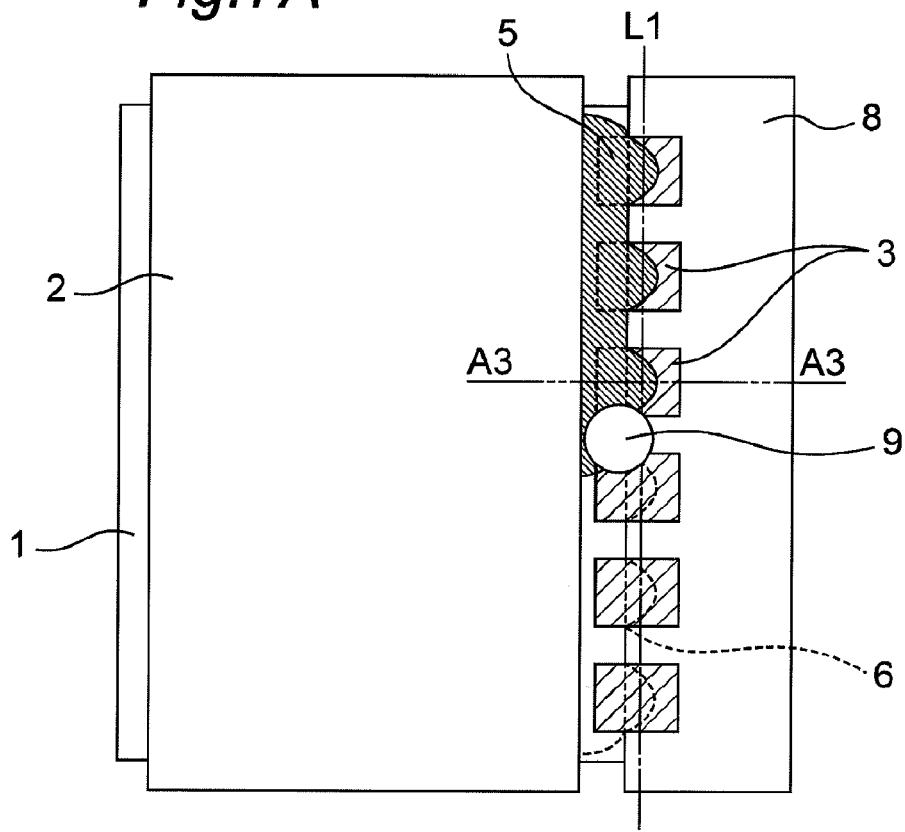
FIG. 7A is a plan view illustrating an appearance of the sealing resin applied in the electrode junction structure according to the first embodiment of the present invention.
Figure 7B:
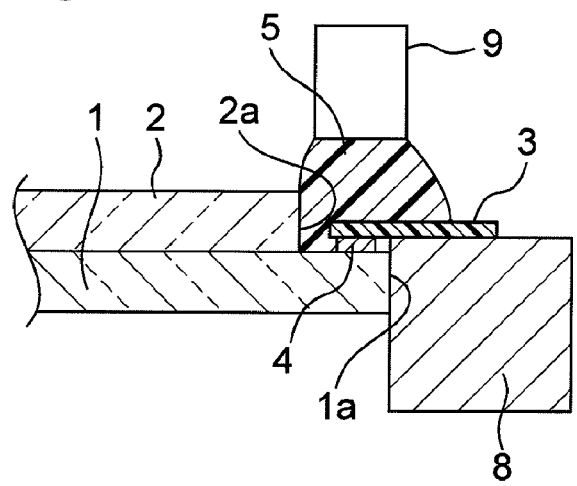
FIG. 7B is a cross-sectional view of FIG. 7A along a line A3-A3.
Figure 8A:
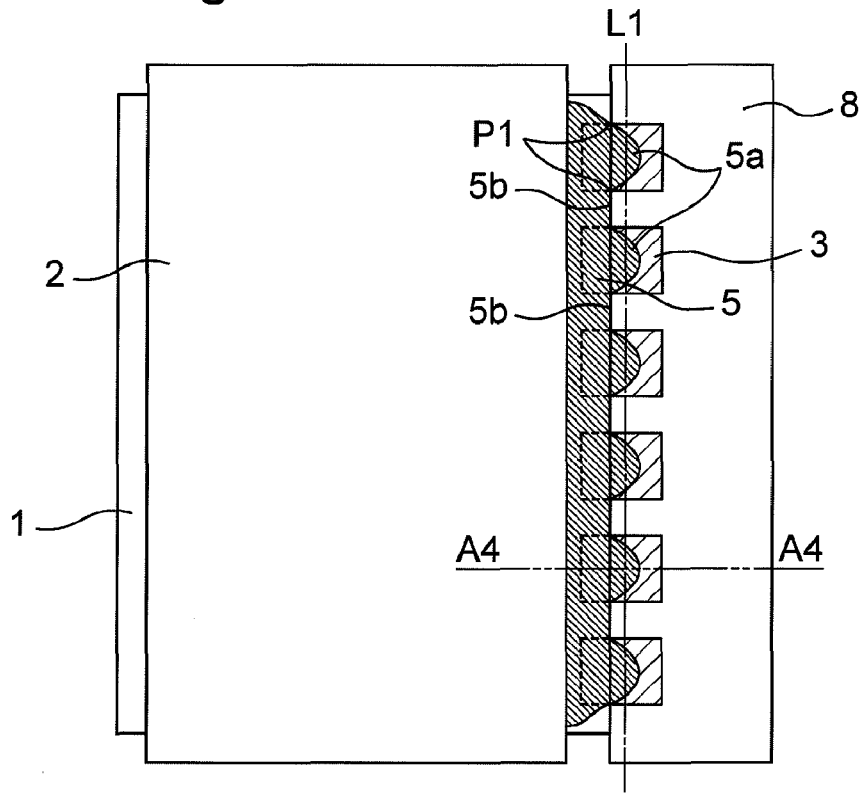
FIG. 8A is a plan view illustrating a state after applying the sealing resin in the electrode junction structure according to the first embodiment of the present invention.
Figure 8B:
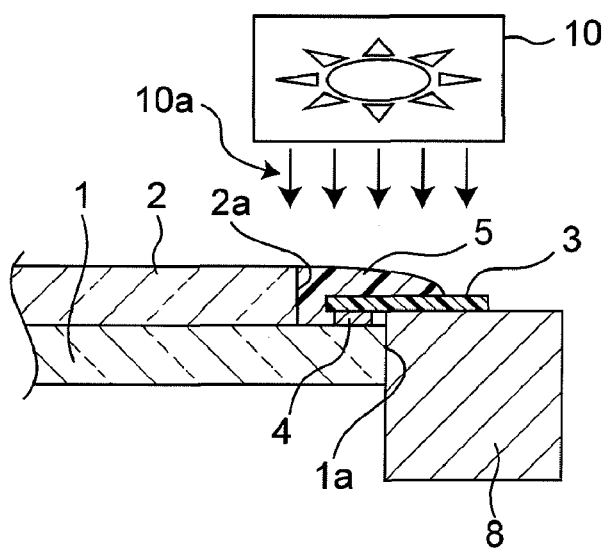
FIG. 8B is a cross-sectional view of FIG. 8A along a line A4-A4.

FIG. 6A is a plan view illustrating a state before forming a sealing resin. FIG. 6B is a cross-sectional view of FIG. 6A along a line A2-A2, which is a diagram also illustrating a cleaning machine for cleaning a portion for forming the sealing resin. FIG. 7A is a plan view illustrating an appearance of the sealing resin applied. FIG. 7B is a cross-sectional view of FIG. 7A along a line A3-A3, which is a diagram also illustrating a sealing resin applicator for applying the sealing resin. FIG. 8A is a plan view illustrating a state after applying the sealing resin. FIG. 8B is a cross-sectional view of FIG. 8A along a line A4-A4, which is a diagram also illustrating an ultraviolet irradiation machine for curing the sealing resin.

First, as shown in FIGS. 6A and 6B, a predetermined portion 6 for forming the sealing resin, the predetermined portion 6 having the same shape as that of the sealing resin 5, is irradiated with argon plasma 7a from a plasma cleaning machine 7 to clean the predetermined portion 6, thereby improving the wettability of the predetermined portion 6. It is noted in this case that the cleaning ability can be improved by adding oxygen to the argon plasma 7a. Alternatively, cleaning of the predetermined portion 6 may be carried out by ultraviolet irradiation. Furthermore, cleaning of the predetermined portion 6 may be carried out while supporting a lower surface of each flexible substrate 3 on a supporting base 8.

After cleaning the predetermined portion 6, the predetermined portion 6 is left for a predetermined period of time (for example, 30 seconds) for drying. It is noted that the drying may be carried out by leaving in a clean room for a predetermined period of time (up to 4 hours).

Then, as shown in FIGS. 7A and 7B, the sealing resin applicator 9 is used to apply the sealing resin 5 to the entire predetermined portion 6, while supporting the lower surface of each flexible substrate 3 on the supporting base 8. In this case, as the material of the sealing resin 5, a material which has flowability, for example, a material which has a viscosity on the order of 3.6 PaS at 36 degrees is used. This will selectively spread the sealing resin 5 in a wettable manner only on a portion with wettability improved if the application temperature of the sealing resin 5 is set at 36 degrees, and thus can eliminate the need to move the plasma cleaning machine 7 along a consecutive waveform portion at an edge of the predetermined portion 6. In other words, the sealing resin 5 can be formed so that the edge of the sealing resin 5 has a consecutive waveform portion, by only moving the sealing resin applicator 9 linearly.

It is noted in this case that the sealing resin 5 is formed in such a way that the sealing resin 5 crosses the edge 1a of the first glass substrate 1 and that the height from the edge 1a of the first glass substrate 1 is uniform in a cross section taken along a plane perpendicular to the surface of the first glass substrate 1, since the sealing resin 5 flows to a convex portion of the predetermined portion 6. In contrast, when the predetermined portion 6 has no convex portion formed, the sealing resin 5 will remain above the edge 1a of the first glass substrate 1, resulting in ununiformity in the height from the edge 1a of the first glass substrate 1 in the cross section described above.

As shown in FIG. 8A, after the sealing resin 5 is spread in a wettable manner over the entire predetermined portion 6, an ultraviolet irradiation machine 10 irradiates the sealing resin 5 with ultraviolet 10a which has, for example, a wavelength of 354 nm and the amount of accumulated light of 2000 mJ or more to cure the sealing resin 5, as shown in FIG. 8B.

This allows the electrode junction structure according to the first embodiment as shown in FIGS. 1 to 5 to be manufactured.

It is noted that while an example has been described above in which the sealing resin applicator 9 is used to place the sealing resin 5 on the predetermined portion 6, the present invention is not limited to this example. For example, a mask for printing provided with a through hole in the same shape as that of the predetermined portion 6 may be used to form, by printing, the sealing resin 5 on the predetermined portion 6.

According to the first embodiment of the present invention, the edge of the sealing resin 5 is, in the planar view, formed so that the edge has a consecutive waveform portion in which the convex portion 5a like a mountain and the concave portion 5b alternate with an imaginary line L1 parallel to the edge 1a of the first glass substrate 1 and located outer than the edge 1a of the first glass substrate 1 as a center axis, and so that the convex portions 5a like a mountain are located on the respective flexible substrates 3. Therefore, when an external force is applied to the flexible substrates 3, stress concentration can be prevented to thus prevent defects from being caused.

Furthermore, according to the first embodiment of the present invention, the convex portions 5a like a mountain are made to be located on the flexible substrates 3. Therefore, as compared with the second conventional example, the flexible substrates 3 can be more easily curved. Thus, the area of the sealing resin 5 and flexible substrates 3 can be reduced in the planar view.

Moreover, according to the first embodiment of the present invention, the formation of the sealing resin 5 by application is carried out after carrying out in advance a treatment of cleaning the predetermined portion 6 to improve the wettability. Therefore, the formation of the sealing resin 5 by application is made easier.

Figure 9:
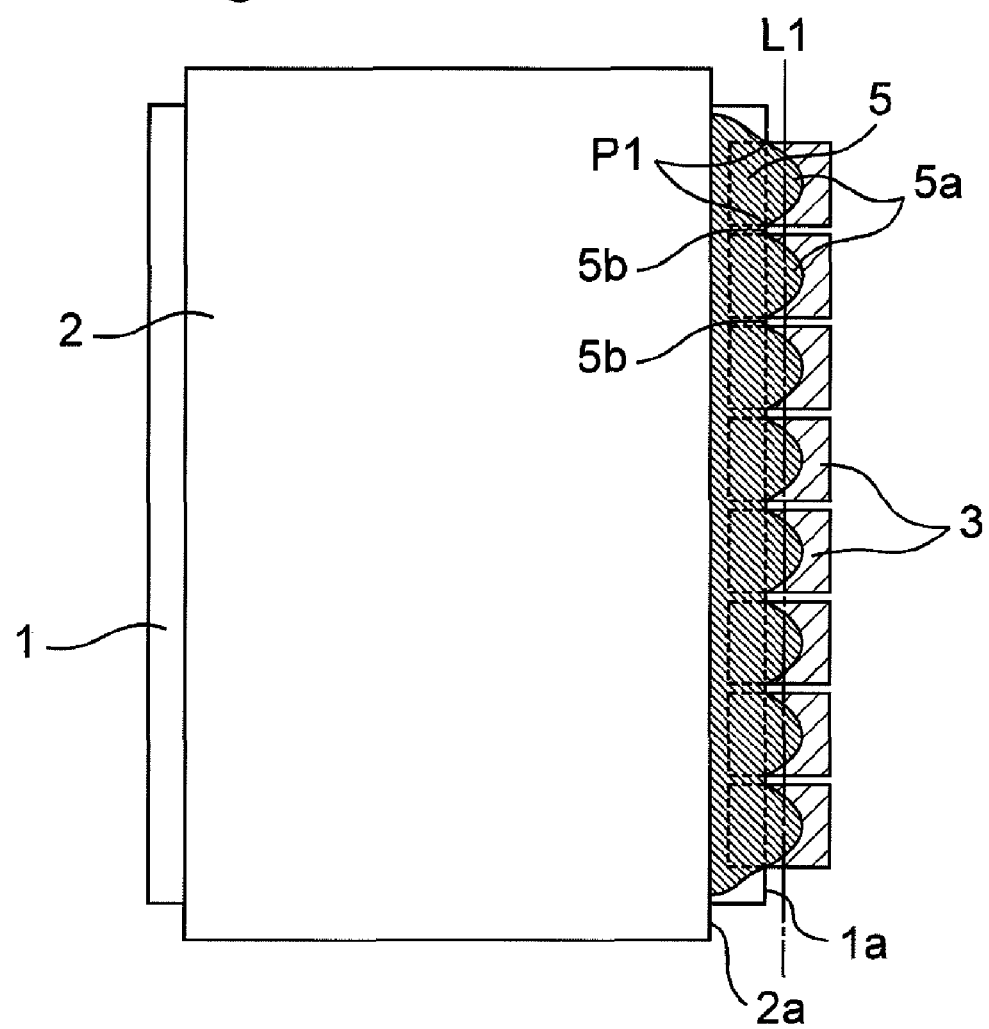
FIG. 9 is a plan view illustrating a state in a case in which flexible substrates arranged at a narrow pitch in the electrode junction structure according to the first embodiment of the present invention.

It is noted that while an arrangement interval between the flexible substrates 3, 3 is shown as the flexible substrates 3, 3 relatively spaced apart in FIGS. 1 and 5, the arrangement interval is generally narrow in PDPs. For example, a width of the flexible substrate 3 in a direction parallel to the edge 1a of the glass substrate 1 is 7.0 cm, a gap between the flexible substrates 3, 3 adjacent to each other is 0.5 cm to 1.0 cm. In this case, the sealing resin 5 is placed as shown in FIG. 9.

Second Embodiment

Figure 10:
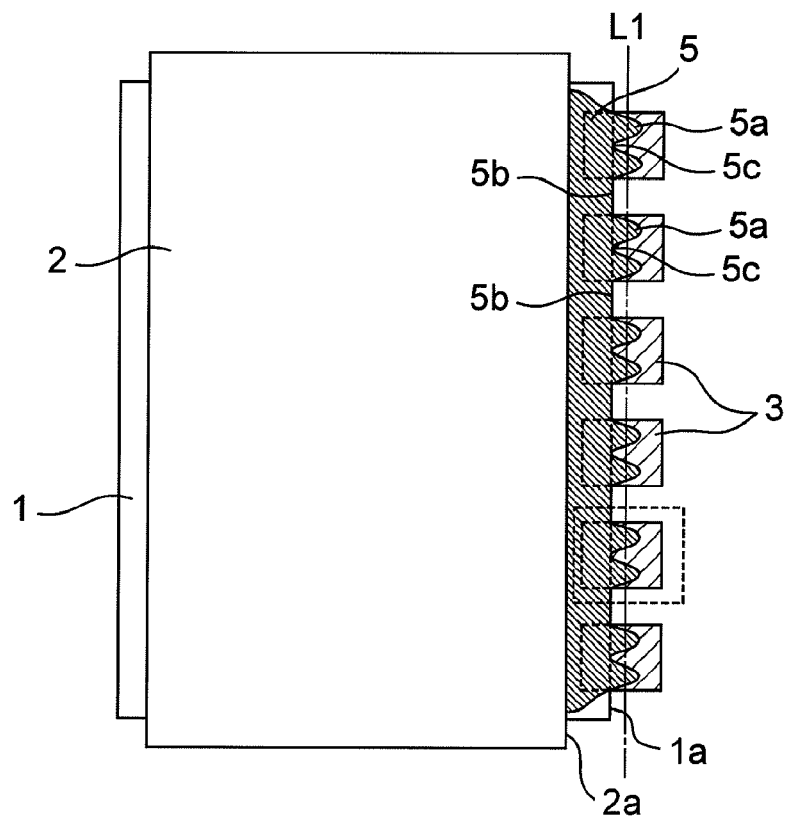
FIG. 10 is a plan view of an electrode junction structure according to a second embodiment of the present invention.
Figure 11:
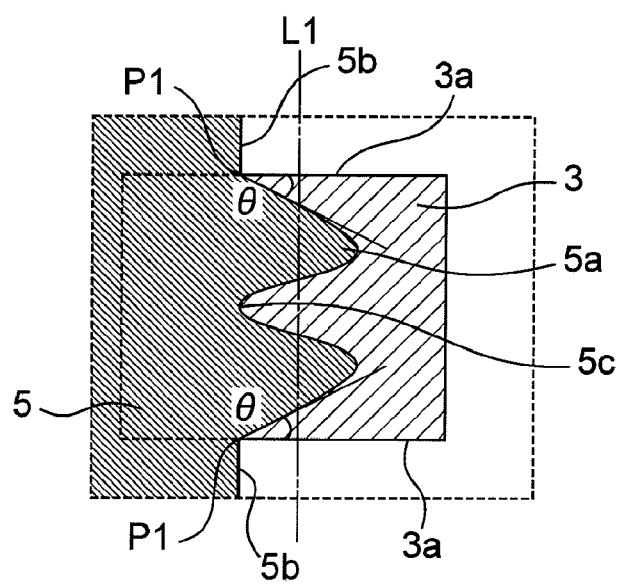
FIG. 11 is an enlarged plan view of a portion of FIG. 10.

FIG. 10 is a plan view illustrating an electrode junction structure according to a second embodiment of the present invention. FIG. 11 is an enlarged plan view of a portion surrounded by a dotted line in FIG. 10. The electrode junction structure according to the second embodiment differs from the electrode junction structure according to the first embodiment described above in that the convex portion 5a of the sealing resin 5 is formed to have two mountain shapes with an inwardly recessed portion 5c.

The formation of the recessed portion 5c in the convex portion 5a can prevent stress concentration to prevent defects from being caused when an external force is applied to the flexible substrates 3, and makes it easier to curve the flexible substrates 3 as compared with the first embodiment described above. Thus, the area of the sealing resin 5 and flexible substrates 3 in the planar view can be reduced more than in the first embodiment described above.

Third Embodiment

Figure 12:
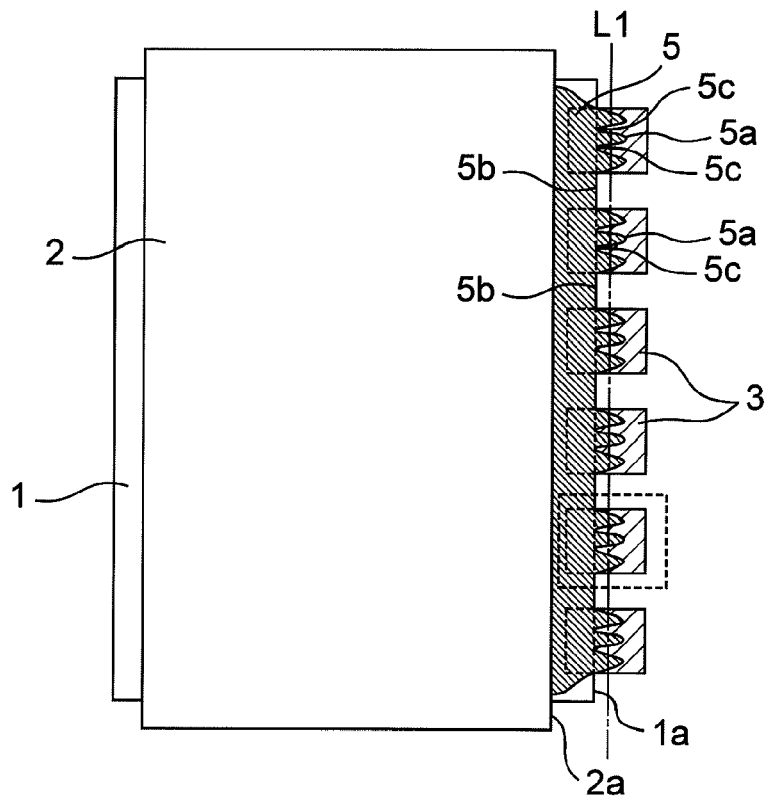
FIG. 12 is a plan view of an electrode junction structure according to a third embodiment of the present invention.
Figure 13:
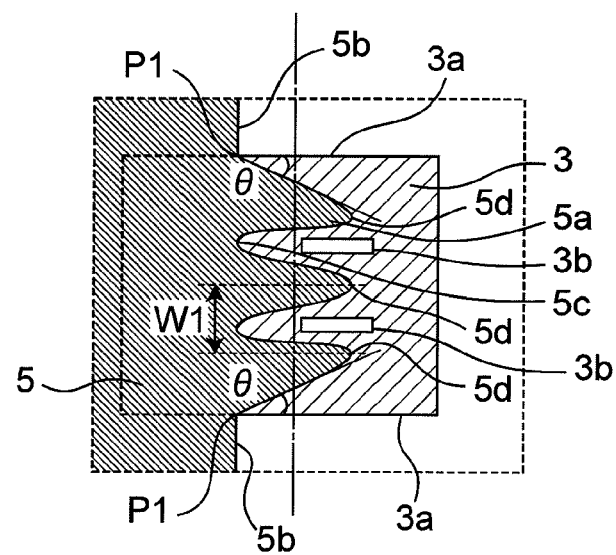
FIG. 13 is an enlarged plan view of a portion of FIG. 12.

FIG. 12 is a plan view illustrating an electrode junction structure according to a third embodiment of the present invention. FIG. 13 is an enlarged plan view of a portion surrounded by a dotted line in FIG. 12. The electrode junction structure according to the third embodiment differs from the electrode junction structure according to the first embodiment described above in that the flexible substrate 3 is provided with two strip-shaped slits 3b and the convex portion 5a of the sealing resin 5 is formed to have three mountain shapes with two inwardly recessed portion 5c.

Providing the flexible substrates 3 with the slits 3b in a direction perpendicular to the edge 1a of the first glass substrate 1 makes it much easier to curve the flexible substrates 3. Furthermore, forming the convex portion 5a with the recessed portions 5c so as to avoid the slits 3b can prevent stress concentration to prevent defects from being caused when an external force is applied to the flexible substrates 3, and makes it easier to curve the flexible substrates 3 as compared with the first embodiment described above. Thus, the area of the sealing resin 5 and flexible substrates 3 in the planar view can be reduced more than in the first embodiment described above.

It is noted that while the two recessed portions 5c are provide to form the convex portion 5a with the three mountain shapes, the present invention is not limited to this structure. Three or more recessed portions 5c may be provided to form the convex portion 5a with four or more mountain shapes. However, in this case, the smaller a width of the mountain shape is, the more easily the mountain shapes are detached from the flexible substrates 3. Therefore, it is preferable to form the convex portion 5a so that heads 5d, 5d of the mountain shapes adjacent to each other are arranged four times or more as much spaced apart as a thickness of a thickest portion of the convex portion 5a. For example, when the thickness of the thickest portion of the convex portion 5a is 1.8 mm, it is preferable that an interval W1 between the heads 5d, 5d of the mountain shapes is 7.2 mm or more. This allows to the width of the mountain shape to be ensured sufficiently, allowing detachment of the mountain shapes from the flexible substrates 3 to be prevented. It is noted that the thickness of the thickest portion of the convex portion 5a is coincident with the thickness of the second glass substrate 2, for example, in the example shown in FIG. 3.

Fourth Embodiment

Figure 14:
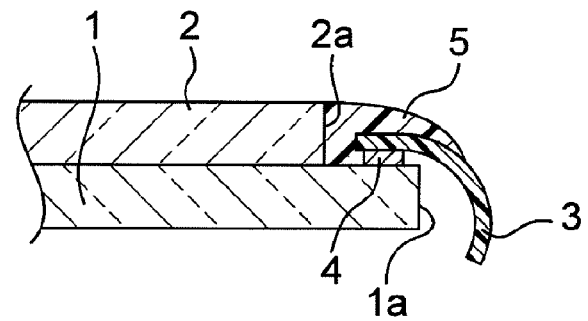
FIG. 14 is a cross-sectional view of an electrode junction structure according to a fourth embodiment of the present invention.

FIG. 14 is a plan view illustrating an electrode junction structure according to a fourth embodiment of the present invention. The electrode junction structure according to the fourth embodiment differs from the electrode junction structure according to the first embodiment described above in that the flexible substrate 3 is held with a portion of the flexible substrate 3 outer than junction portions with the first glass substrate 1 curved by the sealing resin 5.

The area of the sealing resin 5 and flexible substrates 3 in the planar view can be reliably reduced more than in the first embodiment described above by forming the sealing resin 5 in this way.

Next, a method for manufacturing the electrode junction structure according to the fourth embodiment of the present invention will be described with reference to FIGS. 15A to 15D, FIG. 16A, and FIG. 16B. FIGS. 15A to 15D are cross-sectional views illustrating a method for manufacturing the electrode junction structure according to the fourth embodiment. FIG. 16 A is a perspective view illustrating the state of each flexible substrate before forming a sealing resin, whereas FIG. 16B is a perspective view illustrating state in which each flexible substrate is sandwiched between a pair of rod-shaped jigs to arrange the flexible substrates in parallel with each other.

Figure 15A:
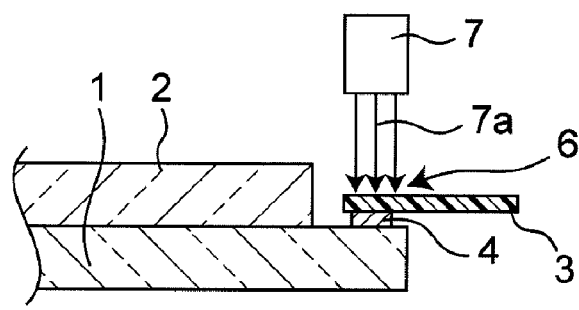
FIG. 15A is a cross-sectional view illustrating a method for manufacturing the electrode junction structure according to a fourth embodiment of the present invention.
Figure 16A:
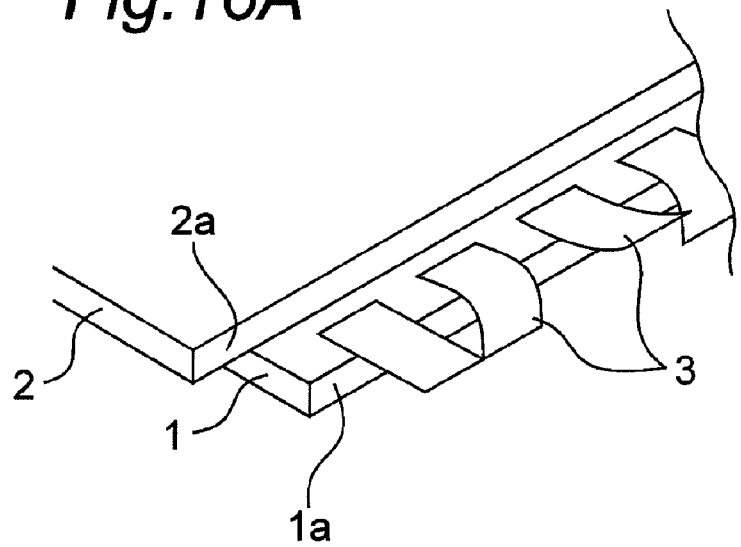
FIG. 16A is a perspective view illustrating the state of each flexible substrate before forming a sealing resin.

First, as shown in FIG. 15A, a predetermined portion 6 is irradiated with argon plasma 7a from a plasma cleaning machine 7 to clean the predetermined portion 6, thereby improving the wettability of the predetermined portion 6. It is noted that cleaning of the predetermined portion 6 may be carried out by ultraviolet irradiation. Furthermore, cleaning of the predetermined portion 6 may be carried out while supporting a lower surface of each flexible substrate 3 on a supporting base 8.

After cleaning the predetermined portion 6, the predetermined portion 6 is left for a predetermined period of time to dry the predetermined portion 6. In this case, each flexible substrate 3 is held with one end open on the first glass substrate 1. Therefore, as shown in FIG. 16A, the flexible substrates 3 are not equal in the angle with respect to the surface of the first glass substrate 1.

Figure 15B:
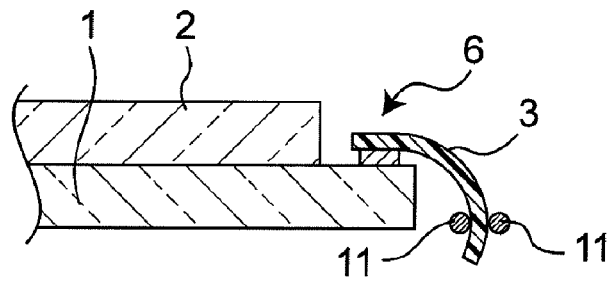
FIG. 15B is a cross-sectional view illustrating a step subsequent to FIG. 15A.
Figure 16B:
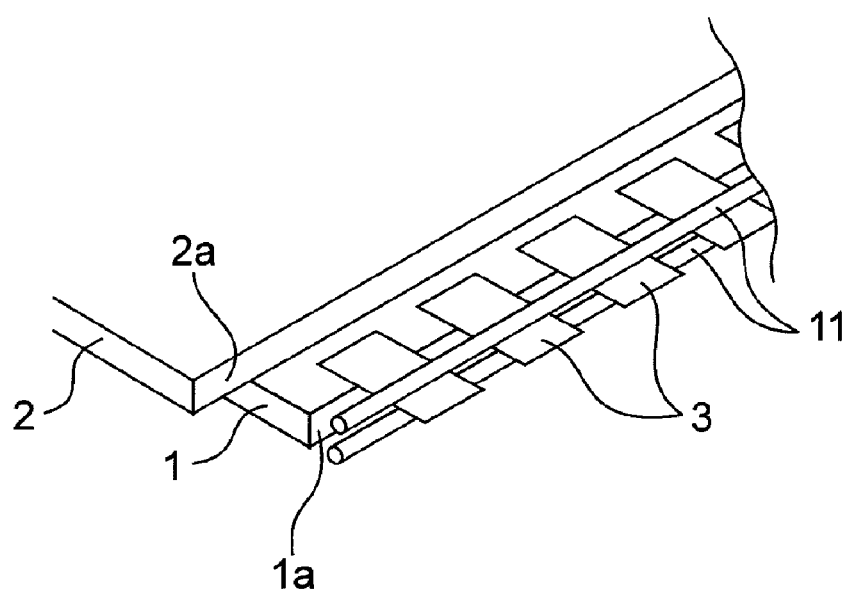
FIG. 16B is a perspective view illustrating a state in which each flexible substrate is sandwiched between a pair of rod-shaped jigs to arrange the flexible substrates in parallel with each other.

Then, as shown in FIG. 16B, each flexible substrate 3 is sandwiched between a pair of rod-shaped jigs 11, 11 to arrange the flexible substrates 3 in parallel with each other. With this state, the pair of rod-shaped jigs 11, 11 is moved to curve each flexible substrate 3 as shown in FIG. 15B.

Figure 15C:
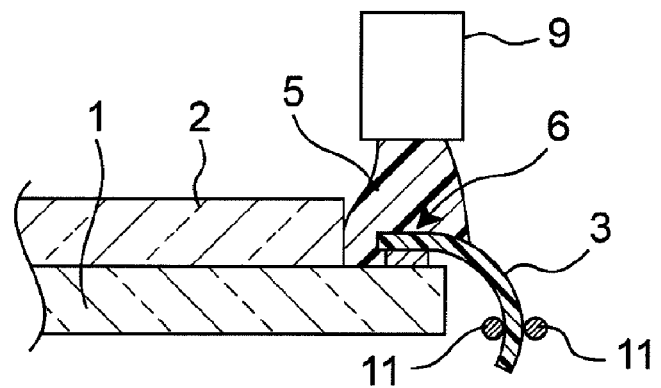
FIG. 15C is a cross-sectional view illustrating a step subsequent to FIG. 15B.

Then, as shown in FIG. 15C, with each flexible substrate 3 curved, a sealing resin applicator 9 is used to apply the sealing resin 5 to the entire predetermined portion 6. In this case, since only the predetermined portion 6 has wettability improved, the sealing resin 5 will be selectively spread in a wettable manner only on the predetermined portion 6. It is noted in this case that it is preferable to use, as the material of the sealing resin 5, a material which has a viscosity enough not to fall down by gravity from the predetermined portion 6.

Figure 15D:
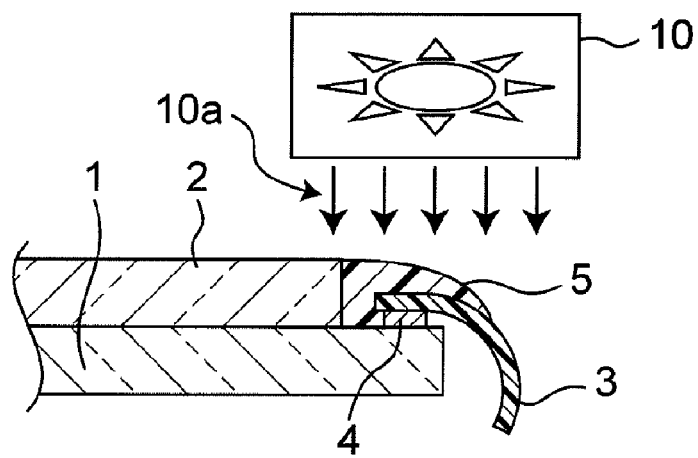
FIG. 15D is a cross-sectional view illustrating a step subsequent to FIG. 15C.

After the sealing resin 5 is spread in a wettable manner over the entire predetermined portion 6, as shown in FIG. 15D, an ultraviolet irradiation machine 10 irradiates the sealing resin 5 with ultraviolet 10a which has, for example, a wavelength of 354 nm and the amount of accumulated light of 2000 mJ or more to cure the sealing resin 5. This allows the electrode junction structure according to the fourth embodiment as shown in FIG. 14 to be manufactured.

Fifth Embodiment

Figure 17:
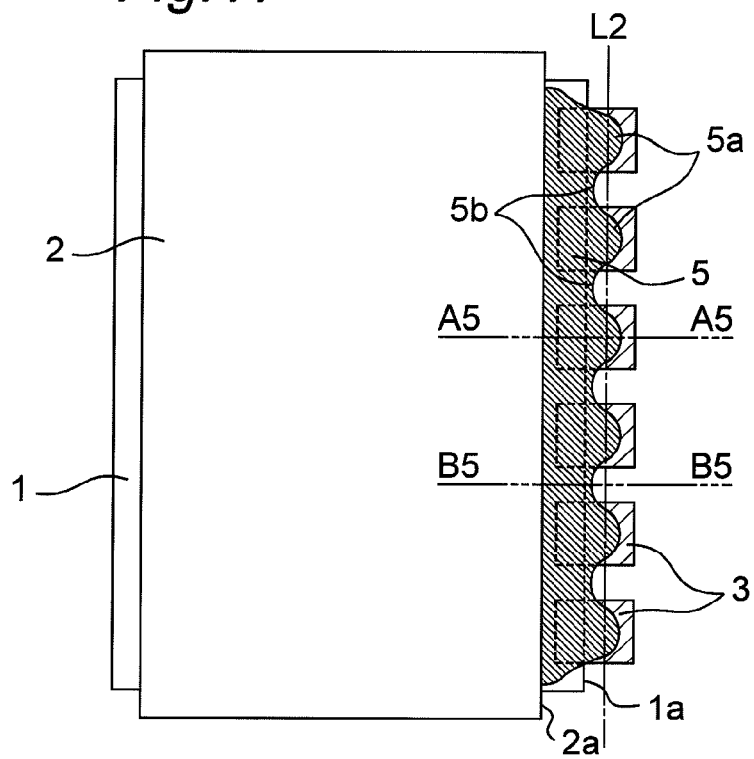
FIG. 17 is a plan view of an electrode junction structure according to a fifth embodiment of the present invention.
Figure 18:
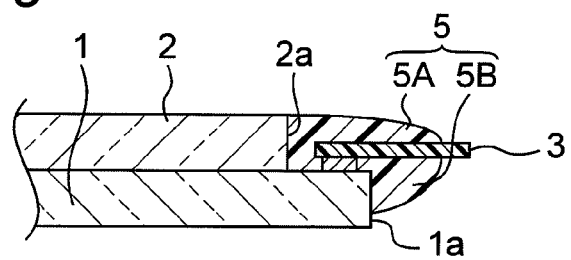
FIG. 18 is a cross-sectional view of FIG. 17 along a line A5-A5.
Figure 19:
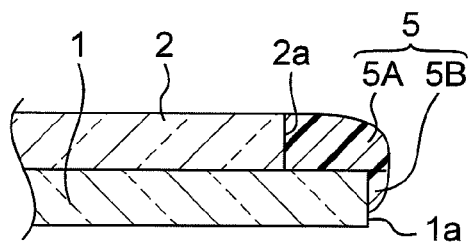
FIG. 19 is a cross-sectional view of FIG. 17 along a line B5-B5.

FIG. 17 is a plan view of an electrode junction structure according to a fifth embodiment of the present invention. FIG. 18 is a cross-sectional view of FIG. 17 along a line A5-A5, and FIG. 19 is a cross-sectional view of FIG. 17 along a line B5-B5. The electrode junction structure according to the fifth embodiment differs from the electrode junction structure according to the first embodiment described above in that the sealing resin 5 is formed on both sides of each flexible substrate 3 and also formed between the flexible substrates 3, 3 adjacent to each other and outer than the edge 1a of the first glass substrate 1 in the planar view.

The sealing resin 5 has, in the planar view, a consecutive waveform portion in which a convex portion 5a like a mountain and a concave portion 5b alternate with an imaginary line L2 parallel to the edge 1a of the first glass substrate 1 and located outer than the edge 1a of the first glass substrate 1 as a center axis, as shown in FIG. 17. Furthermore, the respective convex portions 5a are formed to be located on the flexible substrates 3. The edge 5a of the sealing resin 5 on the flexible substrate 3 and the edge 3a of the flexible substrate 3 intersect with each other at an acute angle.

Moreover, the sealing resin 5 includes a first sealing resin 5A formed on an upper surface side of each flexible substrate 3 and a second sealing resin 5B formed on a lower surface (opposed to the surface of the first glass substrate 1) side of each flexible substrate 3. The first sealing resin 5A and the second sealing resin 5B are integrated in contact with each other between the flexible substrates 3, 3 adjacent to each other.

The formation of the convex portion 5a as described above can prevent stress concentration to prevent defects from being caused when an external force is applied to the flexible substrates 3, more than in first embodiment described above. Furthermore, the convex portions 5a like a mountain located on the flexible substrate 3 make it easier to curve the flexible substrates 3, as compared with the second conventional example. Thus, the area of the sealing resin 5 and flexible substrates 3 in the planar view can be reduced.

Figure 20A:
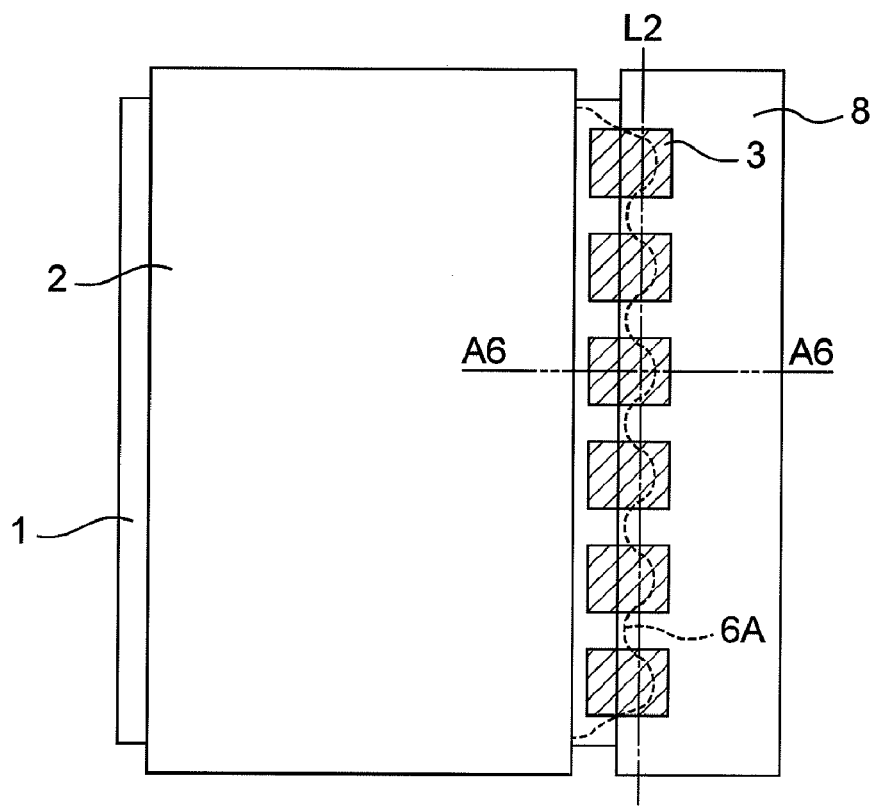
FIG. 20A is a plan view illustrating a state before forming a first sealing resin in the electrode junction structure according to the fifth embodiment of the present invention.
Figure 20B:
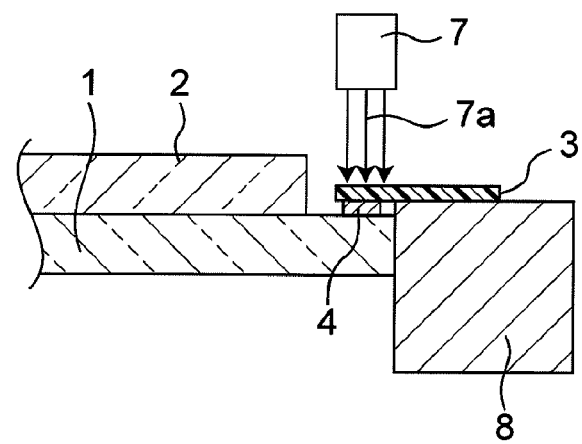
FIG. 20B is a cross-sectional view of FIG. 20A along a line A6-A6.
Figure 21A:
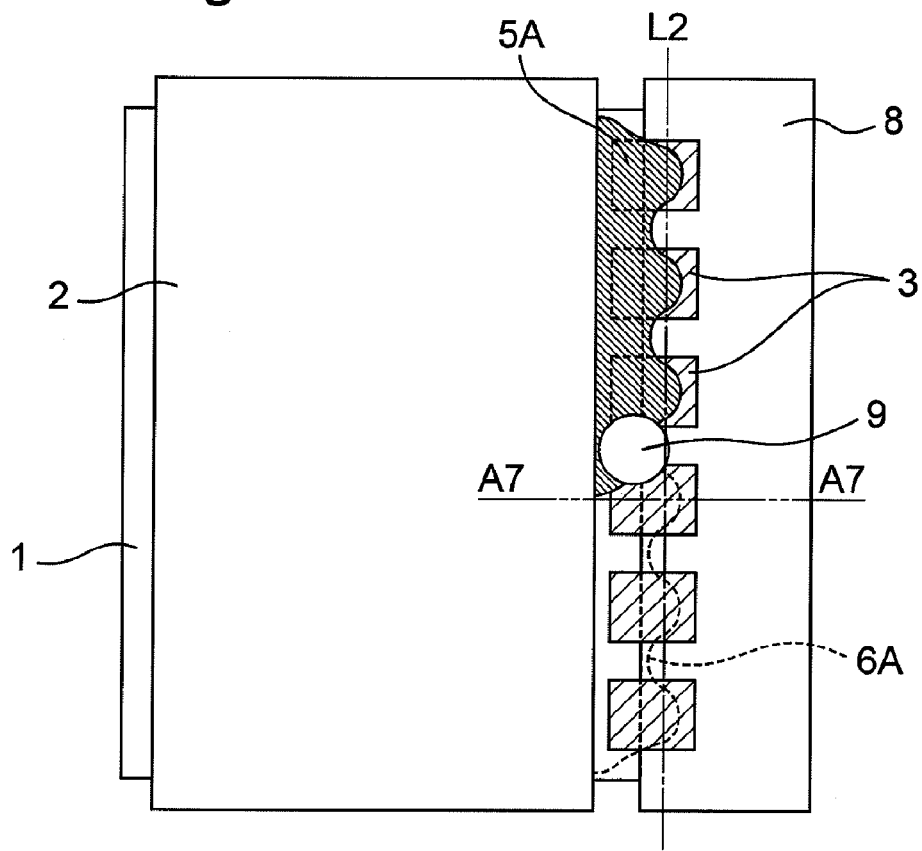
FIG. 21A is a plan view illustrating an appearance of the first sealing resin applied in the electrode junction structure according to the fifth embodiment of the present invention.
Figure 21B:
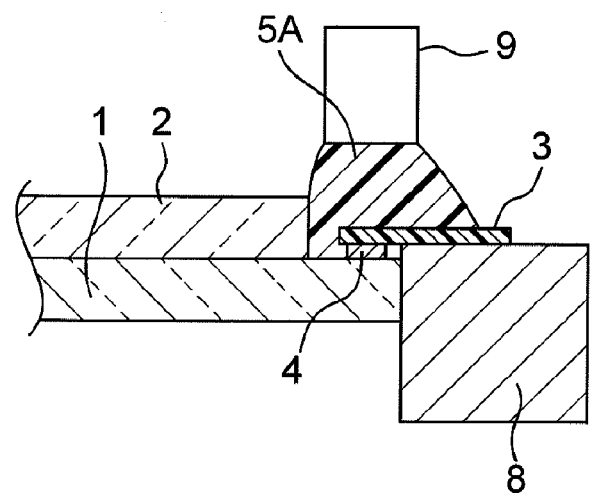
FIG. 21B is a cross-sectional view of FIG. 21A along a line A7-A7.
Figure 22A:
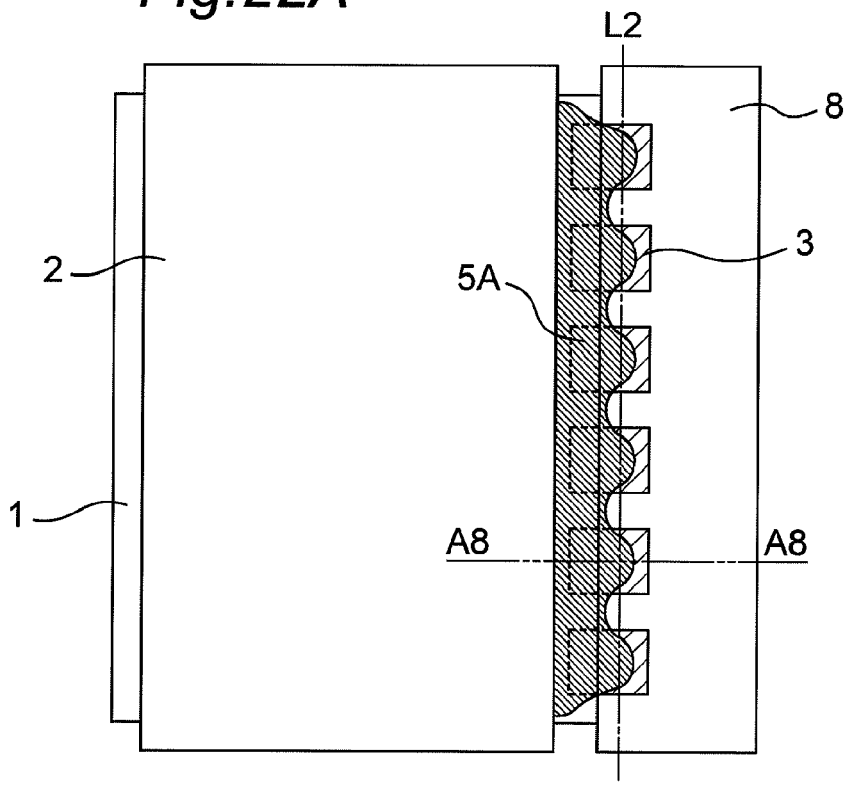
FIG. 22A is a plan view illustrating a state after applying the first sealing resin in the electrode junction structure according to the fifth embodiment of the present invention.
Figure 22B:
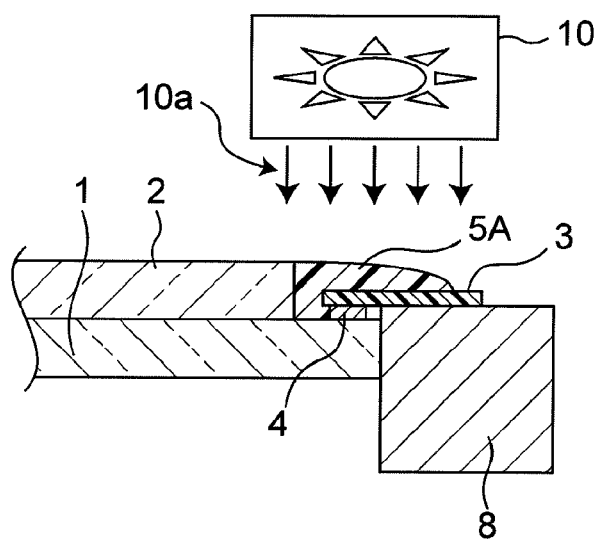
FIG. 22B is a cross-sectional view of FIG. 22A along a line A8-A8.
Figure 23A:
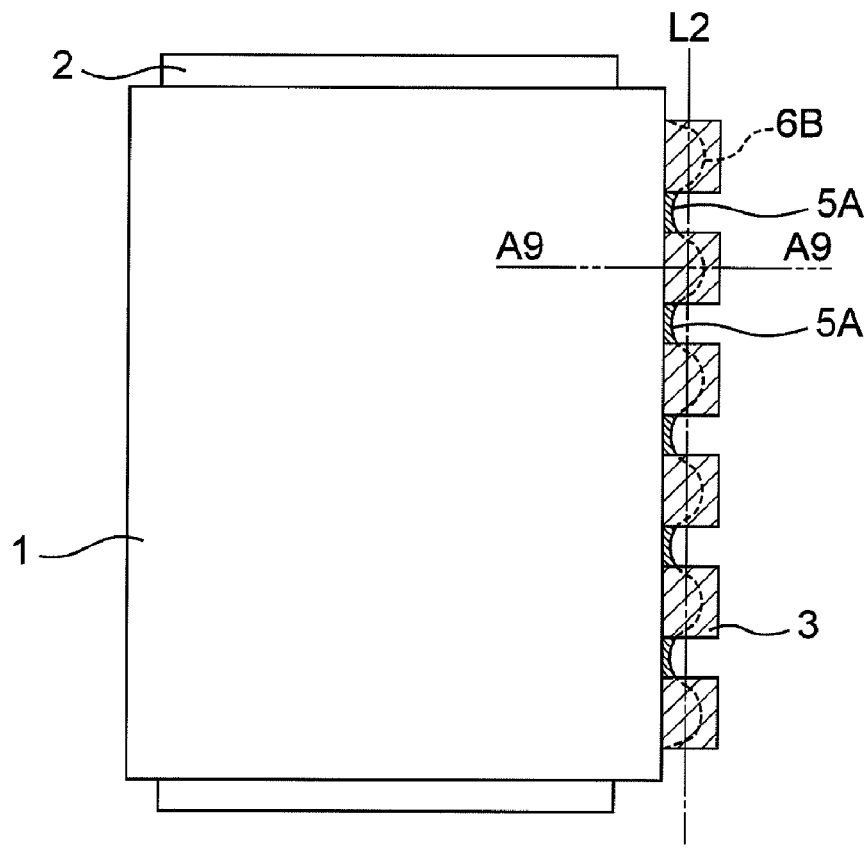
FIG. 23A is a plan view seen from the opposite side to FIG. 20A, illustrating a state before forming the second sealing resin in the electrode junction structure according to the fifth embodiment of the present invention.
Figure 23B:
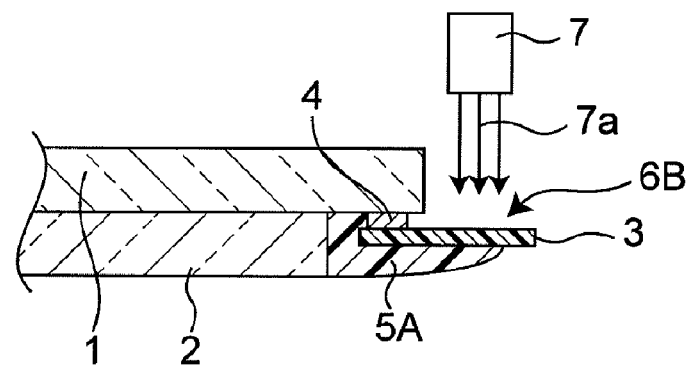
FIG. 23B is a cross-sectional view of FIG. 23A along a line A9-A9.
Figure 24A:
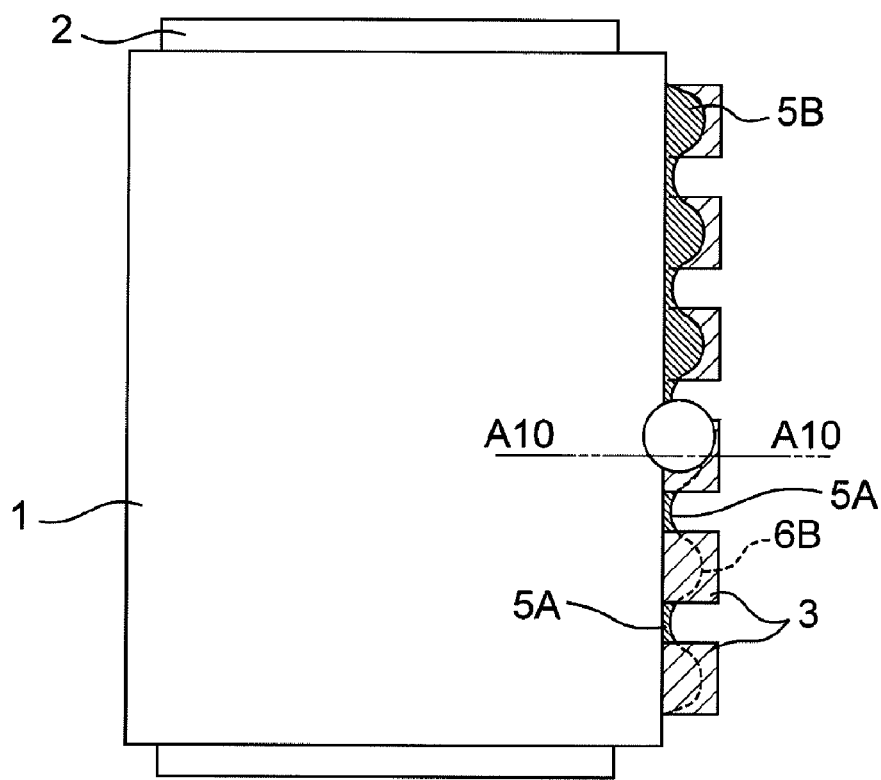
FIG. 24A is a plan view illustrating an appearance of a second sealing resin applied in the electrode junction structure according to the fifth embodiment of the present invention.
Figure 24B:
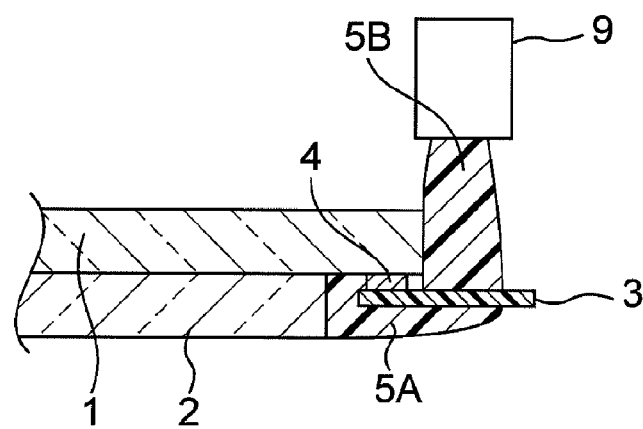
FIG. 24B is a cross-sectional view of FIG. 24A along a line A10-A10.
Figure 25A:
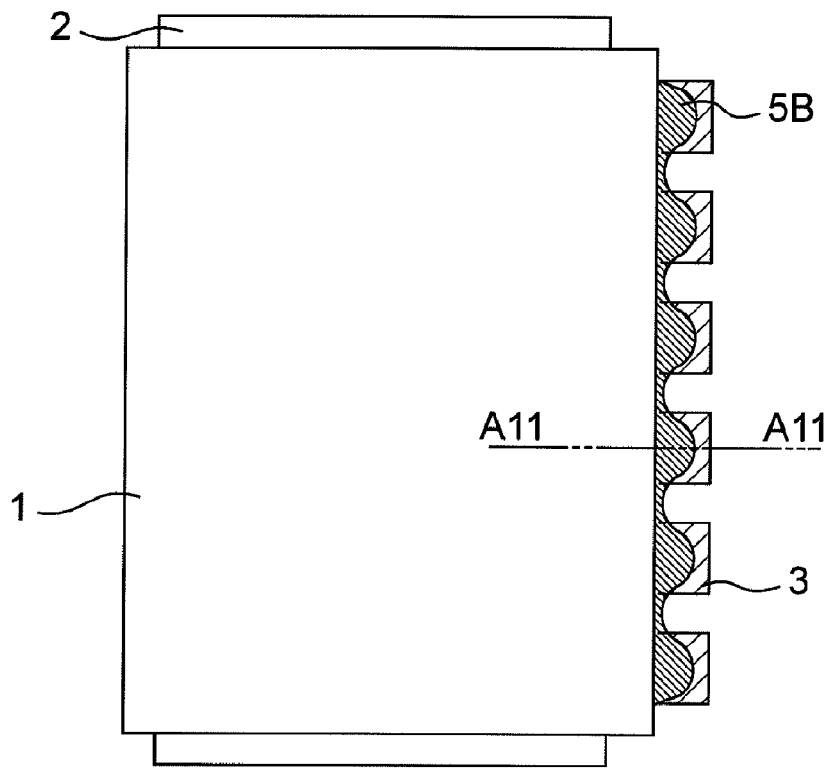
FIG. 25A is a plan view illustrating a state after applying the second sealing resin in the electrode junction structure according to the fifth embodiment of the present invention.
Figure 25B:
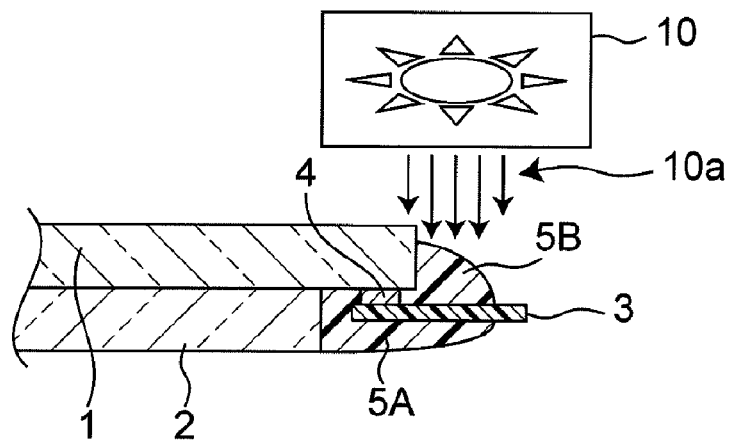
FIG. 25B is a cross-sectional view of FIG. 25A along a line A11-A11.

Next, a method for manufacturing the electrode junction structure according to the fifth embodiment of the present invention will be described with reference to FIGS. 20A through 25B. FIG. 20A is a plan view illustrating a state before forming the first sealing resin. FIG. 20B is a cross-sectional view of FIG. 20A along a line A6-A6, which is a diagram also illustrating a cleaning machine for cleaning a first predetermined portion for forming the first sealing resin. FIG. 21A is a plan view illustrating an appearance of the first sealing resin applied. FIG. 21B is a cross-sectional view of FIG. 21A along a line A7-A7, which is a diagram also illustrating a sealing resin applicator for applying the first sealing resin. FIG. 22A is a plan view illustrating a state after applying the first sealing resin. FIG. 22B is a cross-sectional view of FIG. 22A along a line A8-A8, which is a diagram also illustrating an ultraviolet irradiation machine for curing the first sealing resin. FIG. 23A is a plan view seen from the opposite side to FIG. 20A, illustrating a state before forming the second sealing resin. FIG. 23B is a cross-sectional view of FIG. 23A along a line A9-A9, which is a diagram also illustrating a cleaning machine for cleaning a second predetermined portion for forming the second sealing resin. FIG. 24A is a plan view illustrating an appearance of the second sealing resin applied. FIG. 24B is a cross-sectional view of FIG. 24A along a line A10-A10, which is a diagram also illustrating a sealing resin applicator for applying the second sealing resin. FIG. 25A is a plan view illustrating a state after applying the second sealing resin. FIG. 25B is a cross-sectional view of FIG. 25A along a line A11-A11, which is a diagram also illustrating an ultraviolet irradiation machine for curing the second sealing resin.

First, as shown in FIGS. 20 A and 20B, while supporting the lower surface of each flexible substrate 3 on a supporting base 8, a predetermined portion 6A for forming the first sealing resin is irradiated with argon plasma 7a from a plasma cleaning machine 7 to clean the predetermined portion 6A, thereby improving the wettability of the predetermined portion 6A. It is noted that cleaning of the predetermined portion 6A may be carried out by ultraviolet irradiation. After cleaning the predetermined portion 6A, the predetermined portion 6A is left for a predetermined period of time to dry the predetermined portion 6A.

Then, as shown in FIGS. 21A and 21B, a sealing resin applicator 9 is used to apply the first sealing resin 5A to the entire predetermined portion 6A, while supporting the lower surface of each flexible substrate 3 on a supporting base 8. In this case, since only the predetermined portion 6A has wettability improved, the first sealing resin 5A will be selectively spread in a wettable manner only on the predetermined portion 6A, as shown in FIG. 22A. Furthermore, in this case, the first sealing resin 5A is also located between the flexible substrates 3, 3 adjacent to each other.

Then, as shown in FIG. 22B, an ultraviolet irradiation machine 10 irradiates the first sealing resin 5A with ultraviolet 10a which has, for example, a wavelength of 354 nm and the amount of accumulated light of 2000 mJ or more to cure the first sealing resin 5A.

Then, the electrode junction structure is inverted upside down, and as shown in FIGS. 23A and 23B, a predetermined portion 6B for forming the second sealing resin including a portion of the first sealing resin 5A is irradiated with argon plasma 7a from the plasma cleaning machine 7 to clean the predetermined portion 6B, thereby improving the wettability of the predetermined portion 6B. It is noted that cleaning of the predetermined portion 6B may be carried out by ultraviolet irradiation. After cleaning the predetermined portion 6B, the predetermined portion 6B is left for a predetermined period of time to dry the predetermined portion 6B.

Then, as shown in FIGS. 24A and 24B, the sealing resin applicator 9 is used to apply the second sealing resin 5B to the entire predetermined portion 6B. In this case, since only the predetermined portion 6B has wettability improved, the second sealing resin 5B will be selectively spread in a wettable manner only on the predetermined portion 6B, as shown in FIG. 25A. Furthermore, in this case, the first sealing resin 5A located between the flexible substrates 3, 3 adjacent to each other is in contact with the second sealing resin 5B.

Then, as shown in FIG. 25B, the ultraviolet irradiation machine 10 irradiates the second sealing resin 5B with the ultraviolet 10a which has, for example, a wavelength of 354 nm and the amount of accumulated light of 2000 mJ or more to cure the second sealing resin 5B.

This allows the electrode junction structure according to the fifth embodiment as shown in FIGS. 17 to 19 to be manufactured.

By properly combining the arbitrary embodiments of the aforementioned various embodiments, the effects possessed by the embodiments can be produced.

The electrode junction structure according to the present invention can prevent defects from being caused due to an external force applied to the flexible substrates, and can reduce the area of the sealing resin and flexible substrates in the planar view. Therefore, the electrode junction structure according to the present invention is useful for display devices such as PDPs which require space saving and a larger screen.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of Japanese Patent Application No. 2008-329294 filed on Dec. 25, 2008 including specification, drawing and claims are incorporated herein by reference in its entirety.

The invention claimed is:

1. An electrode junction structure comprising:
    a glass substrate having a plurality of electrodes on a surface of the glass substrate;
    a plurality of flexible substrates which are, in a planar view, arranged to cross over an edge of the glass substrate and arranged to have a space from each other along the edge of the glass substrate, the each of flexible substrates having a plurality of electrodes on a surface of the flexible substrate opposed to the surface of the glass substrate;
    an adhesive for electrically joining the electrodes of the glass substrate and the electrodes of the respective flexible substrates; and
    a sealing resin for covering junction portions between the glass substrate and the respective flexible substrates so as not to be exposed to outside,
    wherein an edge of the sealing resin is formed so that the edge of the sealing resin has, in the planar view, a consecutive waveform portion in which a convex portion and a concave portion alternate with an imaginary line as a center axis, the imaginary line being parallel to the edge of the glass substrate and locating outer than the edge of the glass substrate, and
    wherein the convex portions are formed to be located on the flexible substrates.

2. The electrode junction structure according to claim 1, wherein the edge of the sealing resin on the flexible substrate and the edge of the flexible substrate intersects with each other at an acute angle.

3. The electrode junction structure according to claim 1, wherein the edge of the sealing resin passes through, in the planar view, an intersection point of the edge of the glass substrate with the edge of the flexible substrate.

4. The electrode junction structure according to claim 1, wherein a distance from a top of the convex portion to a bottom of the concave portion in a direction perpendicular to the edge of the glass substrate is 1 mm or more and 6 mm or less.

5. The electrode junction structure according to claim 1, wherein the sealing resin is formed so that a height from the edge of the glass substrate is uniform in a cross section crossing crosses the edge of the glass substrate and taken along a plane perpendicular to the surface of the glass substrate.

6. The electrode junction structure according to claim 1, wherein the convex portion is formed to have a plurality of mountain shapes with at least one inwardly recessed portion.

7. The electrode junction structure according to claim 6, wherein a portion of the flexible substrate corresponding to the recessed portion is provided with a strip-shaped slit.

8. The electrode junction structure according to claim 6, wherein the convex portions are formed so that heads of the mountain shapes adjacent to each other are arranged four times or more as much spaced apart as a thickness of a thickest portion of the convex portions.

9. The electrode junction structure according to claim 1, wherein the flexible substrate is held with a portion of the flexible substrate outer than junction portions with the glass substrate curved by the sealing resin.

10. The electrode junction structure according to claim 1, wherein the sealing resin is formed to exist between the flexible substrates adjacent to each other and outer than the edge of the glass substrate in the planar view.

11. A method for manufacturing an electrode junction structure, comprising:
- arranging a plurality of flexible substrates to cross over an edge of a glass substrate and to have a space from each other along the edge of the glass substrate
- joining the flexible substrates to the glass substrate by an adhesive so that electrodes formed on each substrate are brought into electrical continuity,
- carrying out a treatment for cleaning a predetermined portion for forming the sealing resin to improve wettability, wherein an edge of the predetermined portion has, in the planar view, a consecutive waveform portion in which a convex portion and a concave portion alternate with an imaginary line as a center axis, the imaginary line being parallel to the edge of the glass substrate and locating outer than the edge of the glass substrate, and wherein the convex portions are located on the flexible substrates, and
- forming a sealing resin so that junction portions between the glass substrate and the respective flexible substrates are not exposed to outside.

12. The method for manufacturing an electrode junction structure according to claim 11, wherein the edge of the sealing resin on the flexible substrate and the edge of the flexible substrate intersect with each other at an acute angle.

13. The method for manufacturing an electrode junction structure according to claim 11, wherein the forming the sealing resin is carried out with a portion of the flexible substrate outer than the edge of the glass substrate curved.

14. The method for manufacturing an electrode junction structure according to claim 11,
wherein the forming the sealing resin comprises,
- applying and curing a first sealing resin on one surface side of the flexible substrates, and
- applying and curing a second sealing resin on the other surface side of the flexible substrates.

15. The method for manufacturing an electrode junction structure according to claim 14, wherein,
- when the first sealing resin is to be applied and cured, the first sealing resin is applied and cured so that the first sealing resin is placed between the flexible substrates adjacent to each other, while the other surface of the respective flexible substrates is supported on a support base,
- when the second sealing resin is to be applied and cured, the second sealing resin is applied and cured to exist on the first sealing resin cured between the flexible substrates adjacent to each other.

* * * * *